United States Patent
Wismar et al.

(10) Patent No.: US 9,699,542 B2
(45) Date of Patent: Jul. 4, 2017

(54) HEADSET AMPLIFICATION CIRCUIT WITH ERROR VOLTAGE SUPPRESSION

(71) Applicant: Analog Devices Global, Hamilton (BM)

(72) Inventors: Ulrik Sørensen Wismar, Kalundborg (DK); Sejun Kim, Westford, MA (US)

(73) Assignee: Analog Devices Global, Hamilton (BM)

( * ) Notice: Subject to any disclaimer, the term of this patent is extended or adjusted under 35 U.S.C. 154(b) by 51 days.

(21) Appl. No.: 14/506,062

(22) Filed: Oct. 3, 2014

(65) Prior Publication Data

US 2016/0100243 A1  Apr. 7, 2016

(51) Int. Cl.
*H04R 1/10* (2006.01)
*H04R 29/00* (2006.01)
(Continued)

(52) U.S. Cl.
CPC .......... *H04R 1/1041* (2013.01); *H03F 3/187* (2013.01); *H03F 3/45475* (2013.01);
(Continued)

(58) Field of Classification Search
None
See application file for complete search history.

(56) References Cited

U.S. PATENT DOCUMENTS 3,950,981 A  4/1976 Arrigoni et al.
4,985,925 A  1/1991 Langberg et al.
(Continued)

OTHER PUBLICATIONS

Danylo Hirnyj, "Noise-Cancelling Headphones", Final Project, Phys 406, 2012, 15 pages.
(Continued)

*Primary Examiner* — Muhammad N Edun
(74) *Attorney, Agent, or Firm* — Schwegman Lundberg & Woessner, P.A.

(57) ABSTRACT

A headset driver circuit is described which comprises a connector interface. The connector interface comprises a first terminal, a second terminal and a third terminal for establishing respective electrical connections to a first speaker, a microphone and a common ground node of a headphone, earphone or headset, respectively. A first power amplifier is coupled to the first terminal to supply a first audio output signal to the first speaker of the headset. A first switch arrangement comprises a first ground switch is configured for selectively connecting and disconnecting the second terminal and a ground node of the headset driver circuit. The headset driver circuit further comprises a second ground switch configured for selectively connecting and disconnecting the third terminal and the ground node. The headset driver circuit also comprises a differential preamplifier, e.g. a microphone preamplifier, configured to generate a microphone output voltage where the differential preamplifier comprises a first signal input coupled to the second terminal and a second signal input coupled to the third terminal of the connector interface. An error suppression circuit is configured to sense or sample a noise or error voltage at the second terminal when ground connected or the third terminal when ground connected. The error suppression circuit is further configured to add the sensed or sampled noise or error voltage to a predetermined DC bias voltage and generate an error compensated DC bias voltage for the ungrounded one of the second and third terminals of the connector interface.

22 Claims, 4 Drawing Sheets

(51) Int. Cl.
    *H03F 3/187* (2006.01)
    *H03F 3/45* (2006.01)
    *H04R 5/033* (2006.01)
    *H04R 5/04* (2006.01)

(52) U.S. Cl.
    CPC ....... H04R 29/001 (2013.01); *H03F 2200/03* (2013.01); *H03F 2200/189* (2013.01); *H03F 2203/45541* (2013.01); *H03F 2203/45544* (2013.01); *H03F 2203/45586* (2013.01); *H03F 2203/45588* (2013.01); *H03F 2203/45622* (2013.01); *H04R 5/033* (2013.01); *H04R 5/04* (2013.01)

(56) References Cited

U.S. PATENT DOCUMENTS

| | | |
|---|---|---|
| 5,528,688 A | 6/1996 | Schorr |
| 7,024,004 B2 | 4/2006 | Nishiyama |
| 8,391,506 B1 | 3/2013 | Paul et al. |
| 8,452,024 B2 | 5/2013 | Baranwal et al. |
| 8,594,352 B2 | 11/2013 | Frerking et al. |
| 2001/0053228 A1* | 12/2001 | Jones .................. H04R 1/1083 381/71.6 |
| 2007/0036367 A1 | 2/2007 | Ko |
| 2007/0297623 A1 | 12/2007 | Kuiri |
| 2008/0152166 A1 | 6/2008 | Shiomi |
| 2010/0142718 A1 | 6/2010 | Chin et al. |
| 2010/0260362 A1* | 10/2010 | Sander ................ H04R 1/1041 381/309 |
| 2013/0142350 A1 | 6/2013 | Larsen et al. |
| 2014/0093103 A1 | 4/2014 | Breece, III et al. |
| 2015/0098579 A1* | 4/2015 | Holzmann .......... H04R 29/004 381/71.6 |

OTHER PUBLICATIONS

Jules Ryckebusch, "Build These Noise-Canceling Headphones", Gernsback Publications, 1997, 10 pages.

Prashanth et al., "Design of a Headset Prototype for Speech Detection and Noise Reduction", ICSV 17, The 17th International Congress on Sound & Vibration, Cairo, Egypt, Jul. 18-22, 2010, vol. 5, pp. 3276-3282.

* cited by examiner

HEADSET AMPLIFICATION CIRCUIT WITH ERROR VOLTAGE SUPPRESSION

FIELD OF THE INVENTION

The present invention relates to a headset driver circuit which comprises a connector interface. The connector interface comprises a first terminal, a second terminal and a third terminal for establishing respective electrical connections to a first speaker, a microphone and a common ground node of a headset, headphone or earphone, respectively. A first power amplifier is coupled to the first terminal to supply a first audio output signal to the first speaker of the headset. A first switch arrangement comprises a first ground switch is configured for selectively connecting and disconnecting the second terminal and a ground node of the headset driver circuit. The headset driver circuit further comprises a second ground switch configured for selectively connecting and disconnecting the third terminal and the ground node. The headset driver circuit also comprises a differential preamplifier, e.g. a microphone preamplifier, configured to generate a microphone output voltage where the differential preamplifier comprises a first signal input coupled to the second terminal and a second signal input coupled to the third terminal of the connector interface. An error suppression circuit is configured to sense or sample a noise or error voltage at the second terminal when ground connected or the third terminal when ground connected. The error suppression circuit is further configured to add the sensed or sampled noise or error voltage to a predetermined DC bias voltage and generate an error compensated DC bias voltage for the ungrounded one of the second and third terminals of the connector interface.

BACKGROUND OF THE INVENTION

Embedded audio amplification systems such as those used in various types of portable communication devices such as smartphones, mobile phones, tablets etc. are often connected to external components such as headsets using 4-terminal 2.5 mm or 3.5 mm jack plugs on the headset. The first two terminals, often designated "tip" and "ring 1", are standard stereo connections of left and right loudspeakers of the headset. The last two terminals are used for the microphone signal and the common headset ground. However, different vendors connect the microphone signal and the common ground to different terminals of the jack plug. Some vendors follow a standard of the Open Mobile Terminal Platform (OMTP), and others follow the opposite order. This situation is unfortunate because it is desirable if the embedded audio amplification systems are able to support headsets of both standards. Since the ground connection can be on different terminals or pins of the jack plug there is a need for a ground switch arrangement to support both standards and a detection mechanism which is capable of determining how the jack plug terminals are connected in any particular headset connected to the embedded audio amplification system.

US 2013/0142350 A1 discloses systems and methods for interfacing an audio system with a 4-pin headset jack, and more specifically to multi-standard headset with an integrated grounding switch. A jack sense system for detecting a jack configuration is provided and an arrangement of switches allows a system controller to connect the proper ground and microphone signal terminals of the jack plug to the corresponding terminals of the audio system.

The ground switch or switches required by such a ground switching mechanism will typically comprise a controllable semiconductor switch such as a MOSFET which can be switched between a conducting state and a non-conducting state by control of the gate voltage. However, the controllable semiconductor switch introduces a series resistance in the ground connection of the headset or earphone. Since the ground connection in the 4-pin jack plug is shared between the left and right loudspeakers and the microphone, any resistance therein introduces an undesirable audio signal component, i.e. a noise or error signal, on the microphone ground wire. This is particularly pronounced where the left and/or right loudspeakers of the headset exhibits relatively low impedance in the audio range, for example between 16 and 32 ohms. The low impedance of the loudspeaker(s) leads to a large flow of audio current in the common ground connection and through the ground switch in its conducting state or on-state.

Since the DC bias voltage for the microphone is fixed relative to the ground node or potential of the headset driver circuit, the noise or error signal represents distortion that may add an undesirable echo from the loudspeaker signal or signals to the output signal of the microphone preamplifier. The level of noise or error signal on the common ground connection may be lowered by decreasing a resistance of the ground switch in its on-state. However, this solution is often impractical for example when using semiconductor switches to perform the ground switching. In the latter situation, the larger dimensions required of the semiconductor switches lead to an increase of semiconductor die area and an accompanying increase of manufacturing costs of the semiconductor die. This increase of manufacturing costs is unacceptable for numerous types of cost-sensitive consumer equipment and applications.

The present invention addresses and solves this ground noise problem by using an error suppression circuit configured to sense the noise or error voltage at the terminal of the connector interface which is connected to the ground node or plane of the a headset driver circuit via the active/conducting ground switch. The error suppression circuit superimposes or adds a replica of the noise or error signal at the ground connected terminal to a DC bias voltage of the microphone as described in detail below.

SUMMARY OF THE INVENTION

A first aspect of the invention relates to a headset driver or amplification circuit which comprises a connector interface. The connector interface comprises a first terminal, a second terminal and a third terminal for establishing respective electrical connections to a first speaker, a microphone and a common ground node of a headphone, earphone or headset, respectively. A first power amplifier is coupled to the first terminal to supply a first audio output signal to the first speaker of the headset. A first switch arrangement comprises a first ground switch is configured for selectively connecting and disconnecting the second terminal and a ground node of the headphone driver circuit. The headphone driver circuit further comprises a second ground switch configured for selectively connecting and disconnecting the third terminal and the ground node. The headphone driver circuit also comprises a bias voltage generator is configured to generate a predetermined DC bias voltage and a differential preamplifier, e.g. a microphone preamplifier, configured to generate a microphone output voltage where the differential preamplifier comprises a first signal input coupled to the second terminal and a second signal input coupled to the third terminal of the connector interface. An error suppression circuit is configured to sense or sample a noise or error voltage at the second terminal when ground connected or the third terminal when ground connected. The error suppression circuit is further configured to add the sensed or sampled noise or error voltage to the predetermined DC bias voltage and generate an error compensated microphone DC bias voltage for the ungrounded one of the second and third terminals of the connector interface.

The present headphone driver circuit may be adapted to various types of mono and stereo headphones, earphones, headset etc. with three more connector plugs such as 3-terminal or 4-terminal 2.5 mm jack plugs or 3-terminal or 4-terminal 3.5 mm jack plugs. Stereo headphones, earphones and headsets usually comprise a fourth plug terminal or pin connected to a second loudspeaker of the headset. The connector interface may therefore comprise a fourth terminal in addition to the above-referenced first, second and third terminals. The fourth terminal of the connector interface may be configured to supply a second output signal to the second speaker of the headset for example via a second power amplifier of the headset driver circuit. The connector interface may be purely electrical interface or may comprise a physical connector part for example a 3-terminal or 4-terminal female connector such as a 3-terminal or 4-terminal jack socket.

The error suppression circuit of the present invention addresses and solves the previously discussed ground noise problem by sensing the noise or error voltage at the terminal of the connector interface which is connected to the ground node or plane of the headset driver circuit via a conducting ground switch. The conducting one of the first and the second ground switches will depend on the pin configuration of the headset connected to the headset driver circuit as explained previously. The other ground switch is off or non-conducting such that the error compensated microphone DC bias voltage can be supplied to the terminal coupled to the non-conducting ground switch. A suitable bias or load resistor may be coupled in-between the error compensated microphone DC bias voltage and the terminal coupled to the non-conducting ground switch to set a DC bias current in the microphone amplification circuitry.

The skilled person will understand that each of the first and second ground switches of the first switch arrangement may comprise a semiconductor switch such as a MOSFET, JFET, BJT etc.

The operation of the error suppression circuit leads to the generation of a noise or error voltage component in the error compensated microphone DC bias voltage which may be largely identical, i.e. a replica, of the sensed noise or error voltage at the relevant terminal of the connector interface. By supplying the noise or error voltage component to the first signal input of the differential preamplifier and the sensed noise or error signal to the other, second, input of the differential preamplifier, the differential amplification characteristics leads to a large suppression or cancellation of the noise or error voltage in the output signal of the differential preamplifier. The first and seconds signal inputs of the differential preamplifier may comprise an inverting input and a non-inverting input of an operational amplifier.

The error suppression circuit is preferably configured such that both magnitude and phase of the error voltage component substantially matches the magnitude and phase, respectively, of the sampled error voltage at the relevant terminal of the connector interface. Hence, substantially identical error voltages are applied to the first and second signal inputs of the differential preamplifier to maximize attenuation or cancellation of the error voltage of the output voltage of the differential preamplifier. The matching of the magnitude and phase of the error voltage component and the sampled error voltage at the ground connected terminal is preferably carried out at least throughout a considerable range of the audio frequency band such as between 200 Hz and 8 kHz, or between 100 Hz and 16 kHz.

One embodiment of the headset driver circuit may comprise:

a second switch arrangement configured to coupling the second terminal or the third terminal of the connector interface to an input of the error suppression circuit and a third switch arrangement configured to coupling the error compensated DC bias voltage to the one of the second and third terminals not connected to the input of the error suppression circuit. In manner, a first switch of the second switch arrangement may be used to coupling the error signal to the input of the error suppression circuit when the error signal is present on the second terminal while a second switch of the second switch arrangement may be used to coupling the error signal to the input of the error suppression circuit when the error signal is present on the third terminal. The third switch arrangement may likewise comprise a first switch and a second switch where the first switch is connected between the error compensated DC bias voltage and the second terminal and the second switch is connected between the error compensated DC bias voltage and the third terminal. In this manner, the error compensated DC bias voltage may be selectively applied to either the second terminal or the third terminal of the connector interface by controlling the respective states of the first and second switches of the third switch arrangement.

Another embodiment may further comprise a terminal configuration detector configured to determine a pin configuration of a connected headphone, headset etc. and a digital controller. The digital controller may be configured to control respective state settings of the switches of the first, second and third switch arrangements in accordance with the determined pin configuration of the headphone or headset etc.

The digital controller may be integrated with the headset driver circuit on a common semiconductor substrate. The digital controller may comprise a software programmable microprocessor for example a Digital Signal Processor. The digital controller may alternatively comprise dedicated digital logic circuitry for example comprising sequential and combinational logic blocks implemented on an ASIC or as programmable logic. The terminal configuration detector and the digital controller may be integrated in a common digital control circuit such as the software programmable microprocessor or Digital Signal Processor.

The error suppression circuit may comprise a differential summing amplifier or buffer configured to superimpose the noise/error voltage onto the predetermined DC bias voltage at a first signal input to generate the error compensated microphone DC bias voltage at an output of the summing amplifier. The differential summing amplifier or buffer may comprises a feedback circuit connected from the amplifier output to a second signal input to set a DC gain from the first signal input to the summing amplifier output. The first signal input of the differential summing amplifier may comprise a non-inverting input of an operational amplifier. Various further embodiments and properties of the differential summing amplifier or buffer of the error suppression circuit are discussed below in connection with the appended drawings.

The error suppression circuit may comprise a switched capacitor arrangement comprising first and second capacitors which interact to set a desired DC voltage at the first input of the differential summing amplifier. This embodiment of the error suppression circuit may comprise a first capacitor connected in series between the first input of the differential summing amplifier and a noise or error voltage input of the error suppression circuit. The error suppression circuit further comprises a switched or second capacitor coupled across the predetermined DC bias voltage during a first phase of a two phase non-overlapping switch control signal and coupled across the first capacitor during a second phase of the two phase non-overlapping switch control signal. The frequency of the two phase non-overlapping switch control signal may lie between 250 kHz and 10 MHz. The switched capacitor may be coupled across the predetermined DC bias voltage during the first phase by first and second semiconductor switches coupling opposite electrodes of the switched capacitor to the predetermined DC bias voltage and the ground node, respectively. In this manner, the switched capacitor becomes charged approximately to the DC bias voltage during the first phase.

During the second phase of the two phase non-overlapping switch control signal, third and fourth semiconductor switches may be configured to coupling the opposite electrodes of the switched capacitor to the opposite electrodes of the first capacitor while the first and second semiconductor switches are placed in respective non-conducting states to insulate the switched capacitor from the predetermined DC bias voltage and the ground node. The latter switch arrangement state means that the switched capacitor is connected across the first capacitor such that charge is exchanged between the switched capacitor and the first capacitor. For example may a portion of the charge accumulated on the switched capacitor during the first phase be dumped onto the first capacitor during the second phase. The first capacitor is thereby charged over time to the DC voltage level of the switched capacitor. Hence, by putting the electrodes of the first capacitor in series with a suitable circuit node carrying the error voltage component, the desired superposition or addition of the noise/error voltage and the predetermined DC bias voltage can efficiently be achieved. In one such embodiment of the present headset driver circuit, the circuit node carrying the error voltage component comprises a tapping node of a resistive or a capacitive voltage divider. The resistive or capacitive voltage divider may have an input of the divider coupled to the noise or error voltage and an output of the divider coupled to a first plate or terminal of the first capacitor. A significant advantage of utilizing the above-mentioned switched capacitor arrangements in the error suppression circuit is a small loading of the bias voltage generator which is generating the predetermined DC bias voltage. If the desired voltage level alternatively was to be provided by a resistive coupling arrangement, the resistances of the individual resistors would have to be relatively small to reduce the associated kTC induced thermal noise to an acceptable level at the input of the differential summing amplifier. Small resistors would, however, draw significant DC current out of the bias voltage generator leading to a continuous and higher power consumption of the error suppression circuit.

The input resistance at the first signal input of the differential summing amplifier may for example exceed 1 GΩ, or even exceed 10 GΩ to minimize discharge of the first capacitor while disconnected from the switched capacitor. The capacitance of the first capacitor is preferably larger than 2 pF, for example larger than 10 pF, or even larger than 20 pF. The capacitance of the first capacitor may be at least 10 times larger than an input capacitance of the first signal input of the differential summing amplifier. The latter feature prevents noticeable capacitive loading of the first capacitor caused by capacitive charge sharing with the input capacitance of the differential summing amplifier. The capacitance of the switched capacitor may be substantially identical to the capacitance of the first capacitor or it may be smaller. In some embodiments, the capacitance of the switched capacitor may be smaller than 10 pF, such as smaller than 1 pF.

A second aspect of the invention relates to a semiconductor die or substrate comprising a headset driver circuit according to any of the above-described embodiments thereof. The semiconductor die or substrate may be manufactured in various types of semiconductor process technology such as MOS, CMOS or BiCMOS technology.

A third aspect of the invention relates to a portable communication device comprising: a printed circuit board having mounted thereon a headset driver circuit according to any of the above-described embodiments thereof; and a jack socket comprising a first position connected to the first terminal via a first wire trace of the printed circuit board, a second position connected to the second terminal via a second wire trace of the printed circuit board and a third position connected to the third terminal via a third wire trace of the printed circuit board.

Likewise, a fourth position of the jack socket may be connected to the optional fourth terminal of the connector interface via a fourth wire trace of the printed circuit board.

BRIEF DESCRIPTION OF THE DRAWINGS

Embodiments of the invention are described in more detail below in connection with the appended drawings in which.

DESCRIPTION OF PREFERRED EMBODIMENTS

Figure 1:
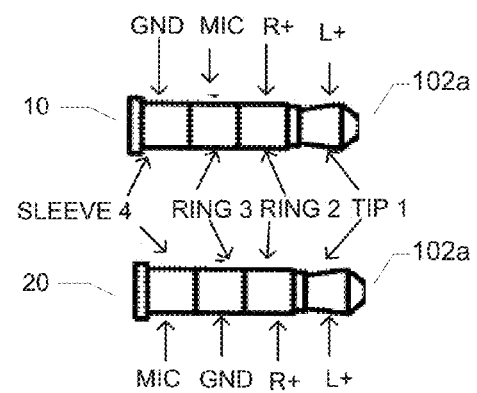
FIG. 1 shows a simplified schematic block diagram of a headset driver circuit in accordance with a first embodiment of the invention.
Figure 1:
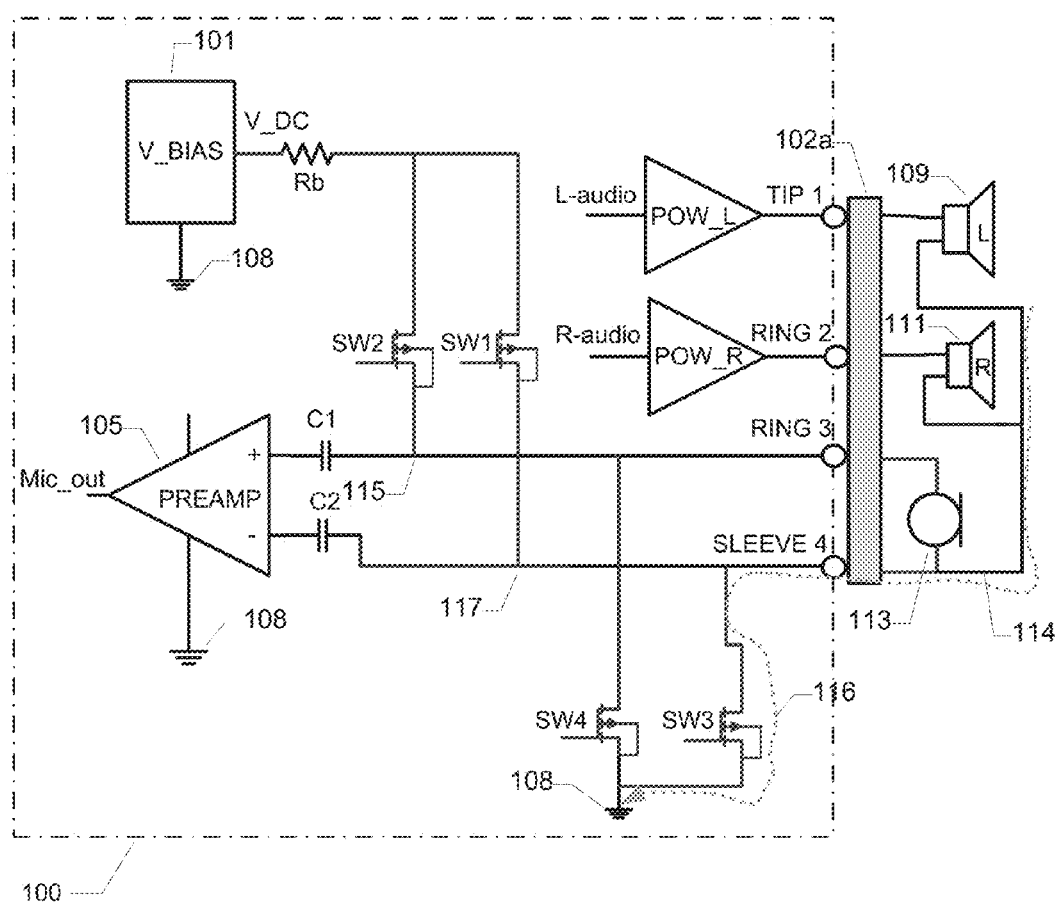

FIG. 1 is a schematic block diagram of a headset driver circuit 100 in accordance with a first embodiment of the invention. The headset driver circuit 100 may be part of an embedded audio amplification system of a portable communication device such as a smartphone, mobile phone, audio enable tablet etc. The portable communication device may for example be connected to an external mono or stereo headset or earphone using a 3-terminal or 4-terminal 2.5 mm or 3.5 mm jack plug on the headset. Various components of a stereo headset are schematically depicted on the drawing. The stereo headset comprises a left ear speaker 109 and a right ear speaker 111 and a microphone 113. The headset also comprises a common ground connection, wire or trace 114 which is shared between the microphone and the left and right ear speakers. This common ground connection 114 is connected to position or pin 4 of a four pin jack plug 102*a*. This pin 4 may be the Sleeve of the jack plug or it may be Ring 3 of the jack plug 102*a* due to the different connectivity standards used by different headset vendors as previously discussed. The present headset driver circuit 100 therefore comprises a ground switching arrangement that allows the common ground 114 to be connected to the appropriate terminal of the connector interface of the headset driver circuit 100 no matter whether the common ground connection 114 of the headset is connected to SLEEVE or RING 3 position of the jack plug of the headset as described in further detail below.

The headset driver circuit 100 comprises a connector interface with four terminals in the present embodiment since it is configured for connection to the above stereo headset with both left and right ear speakers. The headset driver circuit 100 comprises a first terminal TIP 1, a second terminal RING 2, a third terminal RING 3 and a fourth terminal SLEEVE for establishing respective electrical connections to the left ear speaker 109, the right ear speaker 111, the microphone 113 and the common ground node 114 of the headset, respectively. The headset driver circuit 100 additionally comprises a first power amplifier POW_L coupled to the TIP 1 terminal of the connector interface to supply a left ear audio output signal to the left ear speaker 109 and a second power amplifier POW_R coupled to the RING 2 terminal to supply a right ear audio output signal to the right ear speaker 111. The skilled person will appreciate that the left and right ear audio output signals may be mono or stereo signals.

The common ground node 114 of the headset circuitry is coupled to the SLEEVE 4 terminal of the jack plug connector 102a in the illustrated embodiment while a DC bias voltage or power terminal is coupled to the RING 3 terminal, but the common ground and DC bias voltage terminals may be swapped in other types of headsets as discussed above. In order to connect the SLEEVE 4 terminal to the ground node or plane 108 of the headset driver circuit 100 comprises a first switch arrangement comprising a first MOSFET SW3 and a second MOSFET SW4. The first and second MOSFETs SW3, SW4 function as respective first and second ground switches. By appropriately controlling the gate voltage of the first MOSFET SW3 the device is switched between a conducting state/on-state and a non-conducting/off-state. The first MOSFET SW3 provides a relatively low resistance electrical path between the SLEEVE 4 terminal and the ground node in its on-state. The on-resistance may for example lie between 1 and 100 ohm depending on the dimensions of the MOSFET device and the actual gate-source control voltage. The first MOSFET SW3 provides on the other a very large resistance electrical path between the SLEEVE 4 terminal and the ground node 108 in its off-state such that the SLEEVE 4 terminal and the ground node for practical purposes are electrically disconnected. Hence, the first MOSFET SW3 is capable of selectively connecting and disconnecting the SLEEVE 4 terminal and ground node 108.

The second MOSFET SW4 may have the same electrical characteristics as the first MOSFET SW3 and connect the RING 3 terminal to the ground node 108 in its on-state via a low resistance electrical path through SW4 and disconnect the RING 3 terminal from the ground node 108 in the off-state. By appropriately controlling the respective gate voltages of MOSFETs SW3 and SW4, either the SLEEVE 4 terminal or the RING 3 terminal may therefore be connected to the ground node 108 via a low resistance path in accordance with determined pin configuration of the headset coupled to the 4 pin jack connector 102a. The opposite terminal of the connector interface of the terminal connected to the ground node 108 is left essentially floating relative to ground and is instead connected to the output signal of the microphone 113 or the common ground node 114 of the headset. The control of MOSFETs SW3 and SW4 and further switches of the headset driver circuit 100 as discussed below may be carried out by a digital controller integrated with the headset driver circuit 100. The digital controller may comprise a software programmable microprocessor for example a Digital Signal Processor. The digital controller may alternatively comprise dedicated digital logic circuitry for example integrated on an ASIC or implemented in programmable logic. In both cases, the digital controller is configured to control respective settings of the switches of the first switch arrangement and further second and third switch arrangements in accordance with the determined pin configuration of the headset.

The headset driver circuit 100 comprises a differential preamplifier 105 configured to generate a microphone signal voltage at the Mic_out terminal. The microphone output voltage is preferably an amplified or buffered version of the microphone voltage generated by the microphone 113 of the headset. The differential preamplifier 105 may possess a differential signal gain between 10 dB and 30 dB at least across the audio signal range from 100 Hz to 10 kHz. The differential preamplifier 105 comprises a non-inverting, first, signal input which is coupled to the RING 3 terminal of the connector interface via a DC blocking or ac coupling capacitor C1. C1 provides DC isolation between the non-inverting signal input of the preamplifier 105 and signal node 115, which is connected to the second ground switch SW4, while allowing audible frequency components of the microphone signal voltage such as speech and music to pass through to the non-inverting signal input. The differential preamplifier 105 further comprises an inverting, second, signal input which is coupled to the SLEEVE 4 terminal of the connector interface via another DC blocking or ac coupling capacitor C2. C2 provides DC isolation between the inverting signal input of the preamplifier 105 and signal node 117, which is connected to the first ground switch SW3, while allowing audible frequency components of the microphone signal voltage such as speech and music to pass through to the inverting signal input.

The non-inverting, first, signal input of the differential preamplifier 105 will receive the microphone signal voltage if the pins 1-4 or positions 1-4 of the jack connector of the attached headset is configured as illustrated on the schematic diagram with the microphone signal voltage, and also the microphone DC bias voltage, coupled to the RING 3 terminal and the common ground node 114 coupled to the SLEEVE 4 terminal. This configuration corresponds to the jack connector pin configuration illustrated on upper picture 10 of the jack connector. The digital controller (not shown) has connected the SLEEVE 4 terminal to the ground node 108 via SW3 while SW4 is put into its off-state. A differential microphone signal voltage is thereby developed across the inverting and non-inverting signal inputs of the differential preamplifier 105 corresponding to the microphone signal voltage appearing across the microphone ground and DC bias voltage. The DC bias voltage also functions as the audio signal output due to the two-terminal DC bias arrangement of the microphone. On the other hand if the pins 1-4 of the jack connector of the attached headset is configured as illustrated on the jack connector pin configuration on the lower picture 20, the microphone signal voltage, and further the microphone DC bias voltage, is coupled to the SLEEVE 4 terminal and the RING 3 terminal is coupled to the common ground node 114. This is achieved by coupling the RING 3 terminal to the ground node 108 by setting SW4 in its on-state. SW3 is now put into its off-state allowing the microphone signal voltage (and DC bias voltage) to appear to the SLEEVE 4 terminal. A differential microphone signal voltage is once again developed across the inverting and non-inverting signal inputs of the differential preamplifier 105 and the microphone output voltage is generated on Mic_out. However, because the power supply of the differential preamplifier 105 and other circuitry of the headset driver circuit 100 refers to the ground voltage at the ground node 108 while the common ground node 114 is connected to a voltage potential that is different from ground node 108 due to a finite on-resistance of the SW3 and SW4 MOSFET switches, a noise or error voltage is developed on the ground connected terminal, RING 3 or SLEEVE 4 as the case may be, of the connector interface. The noise or error voltage may for example be generated by the flow of audio current through the left ear speaker 109 and/or the right ear speaker 111 and through the common ground node or terminal 114 of the headset as schematically illustrated by dotted current flow path 116. This noise or error voltage appears in amplified form at the Mic_out voltage of the differential preamplifier 105 unless preventive measures are taken to cancel or at least suppress this error voltage as discussed below in additional detail with reference to FIGS. 2 & 3.

The headset driver circuit 100 comprises further a bias voltage generator 101 configured to generate a predetermined DC bias voltage V_DC. The bias voltage generator 101 may comprise a bandgap reference to provide an accurate and temperature stable DC bias voltage. The previously discussed DC bias voltage supply for the microphone 113 of the headset delivered either through the RING 3 or SLEEVE 4 terminal, as the case may be, is derived from this predetermined DC bias voltage V_DC. In the simplified block diagram 100, a third switch arrangement, comprising MOSFET switches SW1, SW2, is configured to coupling the predetermined DC bias voltage to either the RING 3 terminal or the SLEEVE 4 terminal. SW1 and SW2 are preferably PMOS transistors, but other transistor types like NMOS or BJT or FET may be used instead. When SW1 is placed in its on-state by the digital controller it connects the predetermined DC bias voltage to the SLEEVE 4 terminal. The digital controller sets at the same time SW2 to its off-state so as to disconnect the RING 3 terminal when the SLEEVE 4 terminal is connected to the predetermined DC bias voltage. The skilled person will appreciate that SW1 and SW2 assume opposite states when the predetermined DC bias voltage is to be applied to the RING 3 terminal due to the above-discussed alternative configuration of the headset jack plug. A bias or load resistor Rb is placed in series with the predetermined DC bias voltage and sets a DC bias current flowing in an internal amplification or buffer transistor or circuit of the headset microphone. The selection of resistance of the bias resistor Rb depends on characteristics of the headset microphone, but may typically lie between 1 and 10 kΩ. The presence of the bias or load resistor also allows the microphone audio or signal voltage to be developed on node 115 or node 117, as the case may be, without being shorted by low DC and AC output impedance of the bias voltage generator 101.

The headset driver circuit 100 further comprises an error suppression circuit (not shown on FIG. 2) which is left out of the simplified schematic diagram of the driver circuit 100. This error suppression circuit senses or samples the previously discussed error or noise voltage and may be integrated with the bias voltage generator 101 to generate an error compensated DC bias voltage at the V_DC output as shown in detail in FIGS. 3 & 4.

Figure 2:
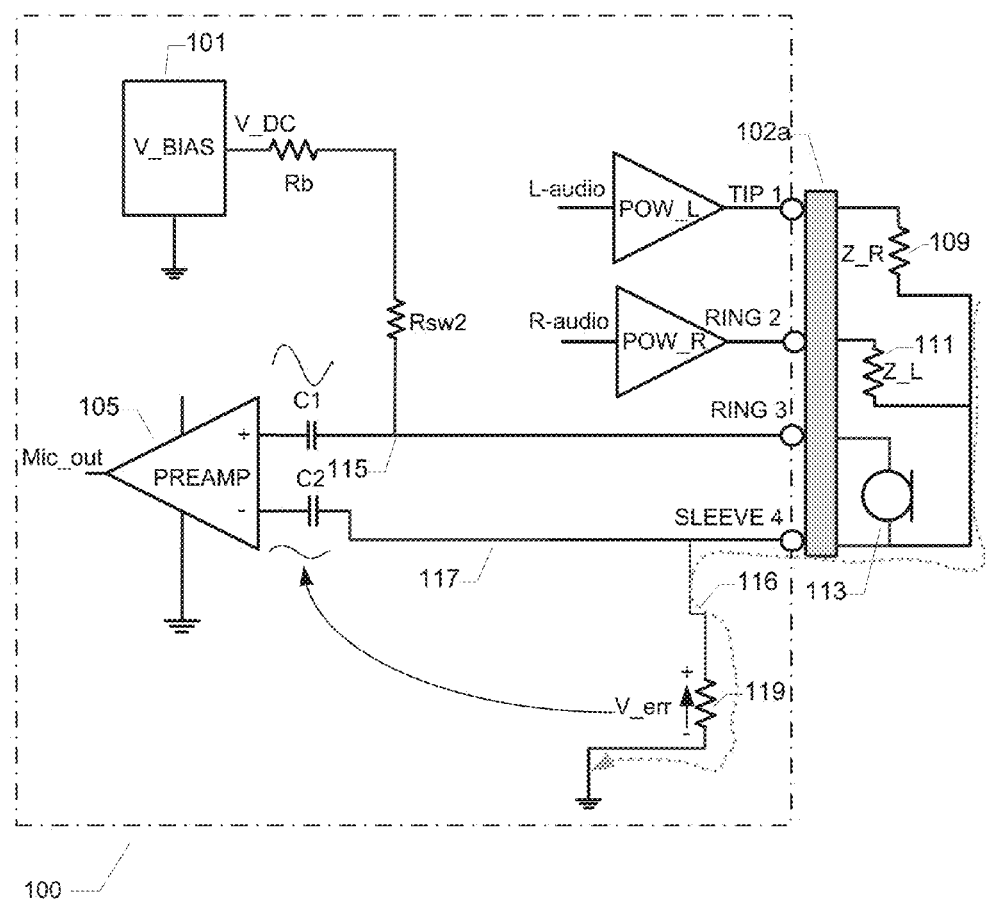
FIG. 2 is a simplified schematic block diagram of the headset driver circuit headset driver circuit with added error signal voltages.

The cause of the error or noise voltage on the SLEEVE 4 terminal is further illustrated by the simplified schematic block diagram of the headset driver circuit 100 on FIG. 2.

The simplified schematic block diagram illustrates the same configuration of the headset jack plug connector as FIG. 1, but with the individual MOSFET switches of the first and second switch arrangements left out for simplicity. Since the SW3 MOSFET ground switch resides in its on-state, SW3 has been replaced by its corresponding on-resistance 119. SW3 and SW4 are preferably NMOS transistors, but other transistor types like PMOS or BJT or FET may be used instead. The on-resistance of MOSFET SW2 has been replaced by its corresponding on-resistance Rsw2 which typically is small compared to the resistance of the bias resistor Rb. MOSFET switches SW4 and SW1 are placed in their off-states which essentially correspond to open circuits due to the very large off-state resistance. The latter switch devices have consequently been removed from the simplified schematic diagram. The left ear speaker 109 and right ear speaker 111 have been replaced by their respective audio frequency impedances Z_R and Z_L. The supply of audio signal voltages to the left ear speaker 109 and right ear speaker 111 by the left and right power amplifiers, respectively, lead to the previously mentioned flow of audio signal current in the common ground connection, wire or trace 114 of the headset. The audio frequency impedance of each of Z_R and Z_L may be quite low for example around 16Ω, or even less, which means that the corresponding audio signal current flowing through dotted current flow path 116 may be quite large. This flow of audio signal current runs through the on-resistance 119 of the MOSFET ground switch SW3 and develops the previously discussed noise or error voltage V_err across the on-resistance 119. Hence, the error voltage V_err is superimposed on the SLEEVE 4 terminal which in turn is connected to the inverting input of the differential preamplifier 105 via the coupling capacitor C2. This error voltage may for example sound as an annoying echo added to the desired far-end voice signal of the microphone output voltage Mic_out. This may be subjectively annoying for the user and also present a problem to a machine based voice recognition system or device.

The skilled person will understand that while the respective on-resistance of the MOSFET switches SW3 and SW4 can be reduced to very small values by making dimensions of the MOSFET semiconductor layouts very large, this is an impractical solution to reduce the error voltage because of the associated increase of semiconductor die area. This increase of semiconductor die area translates directly to a corresponding and generally unacceptable cost increase of the headset driver circuit 100 for numerous types of applications, in particular high-volume consumer goods such as portable communication devices where low component costs are essential.

The operation of the previously-mentioned error suppression circuit will be explained in detail with reference to the detailed schematic block diagram of the headset driver circuit 300 on FIG. 3. The detailed schematic block diagram 300 illustrates the same configuration of the headset jack plug connector as FIG. 1 with the same states of the individual MOSFET switches of the first and second switch arrangements as FIG. 2. The error suppression circuit 333 comprises the previously-mentioned second switch arrangement comprising individual MOSFET switches SW5 and SW6. The error suppression circuit further comprises a differential summing amplifier 321 configured to superimpose or add the noise/error voltage, received either through MOSFET switch SW5 or through MOSFET switch SW6, onto the predetermined DC bias voltage V_DC supplied by the bias voltage generator 301. SW5 and SW6 are preferably PMOS transistors, but other transistor types like NMOS or BJT or FET may be used instead. The differential summing amplifier 321 comprises a resistive feedback network comprising resistors Rs1 and Rs2. Rs1 is coupled from an inverting input of the differential summing amplifier 321 to a ground node or potential 108 of the headset driver circuit 300 while Rs2 is coupled from an output of the differential summing amplifier 321 back to its inverting input. The ratio between Rs1 and Rs2 can therefore be used to set a DC and AC amplification or gain of the differential summing amplifier 321 from its non-inverting input to the output. The error suppression circuit comprises further a pair of summing resistors Rs3 and Rs4 which each has a first end or terminal connected to the non-inverting input of the differential summing amplifier 321. The second, opposite, end or terminal of the summing resistor Rs4 is connected to the respective outputs terminals of the MOSFET switches SW5 and SW6. Hence, depending on the states of MOSFET switches SW5 and SW6 either the signal at node 315 and the RING 3 terminal or the signal at node 317 and the SLEEVE 4 terminal is applied to the second end of the summing resistor Rs4. The second, opposite, end or terminal of the summing resistor Rs3 is connected to the DC bias voltage V_DC supplied by the bias voltage generator 301. Consequently, the non-inverting input of the differential summing amplifier 321 functions as a summing node adding or superimposing the noise/error voltage V_err sampled from either the RING 3 terminal or the SLEEVE 4 terminal, according to the respective states of SW5 and SW6, to the DC bias voltage V_DC.

The ratio between Rs1 and Rs2 may be used to set a suitable DC amplification/gain or attenuation of the differential summing amplifier 321 such that the DC voltage output of the differential summing amplifier 321 complies with a nominal or desired DC bias voltage of the microphone 313 of the headset. The ratio between the summing resistors Rs3 and Rs4 may be used to set the AC signal gain or attenuation of the noise/error voltage from the second terminal of the summing resistor Rs4 to the output of the differential summing amplifier 321. By appropriate selection of the resistances of the summing resistors Rs3 and Rs4, the magnitude of the noise/error voltage component of the output voltage of the differential summing amplifier 321 can be set such that it accurately matches the magnitude of the noise or error voltage at the RING 3 or the SLEEVE 4 terminal, as the case may be, caused by the ground resistance. The matching between the Rs1 to Rs2 ratio and the Rs3 to Rs4 ratio should be good to obtain the most accurate suppression of the noise/error voltage V_err. Accurate passive component matching can readily be achieved by applying appropriate layout techniques of integrated circuit technology to the headset driver circuit.

Consequently, the output voltage of the differential summing amplifier 321 supplies an error compensated microphone DC bias voltage for the interface terminal connected to the DC bias voltage supply terminal of the microphone 313, i.e. either the RING 3 or SLEEVE 4 terminal, as the case may be. The selection of interface terminal to which the error compensated microphone DC bias voltage is supplied is controlled by an appropriate selection of states of the MOSFET switches SW1, SW2 as discussed above in connection with FIG. 1. Preferably, the differential summing amplifier 321 and its DC and AC gain setting circuitry is configured to minimize phase shift in a transfer function between the second terminal of the summing resistor Rs4 and the error compensated microphone DC bias voltage at least in the audio frequency range between 100 Hz and 10 kHz. This feature ensures that both the magnitude and phase of the error voltage component of the output voltage of the differential summing amplifier 321 matches the magnitude and phase of the error voltage at the RING 3 or the SLEEVE 4 terminal. Hence, maximizing the attenuation of the noise or error voltage at the output of the differential preamplifier 305, i.e. the Mic_out voltage.

Figure 3:
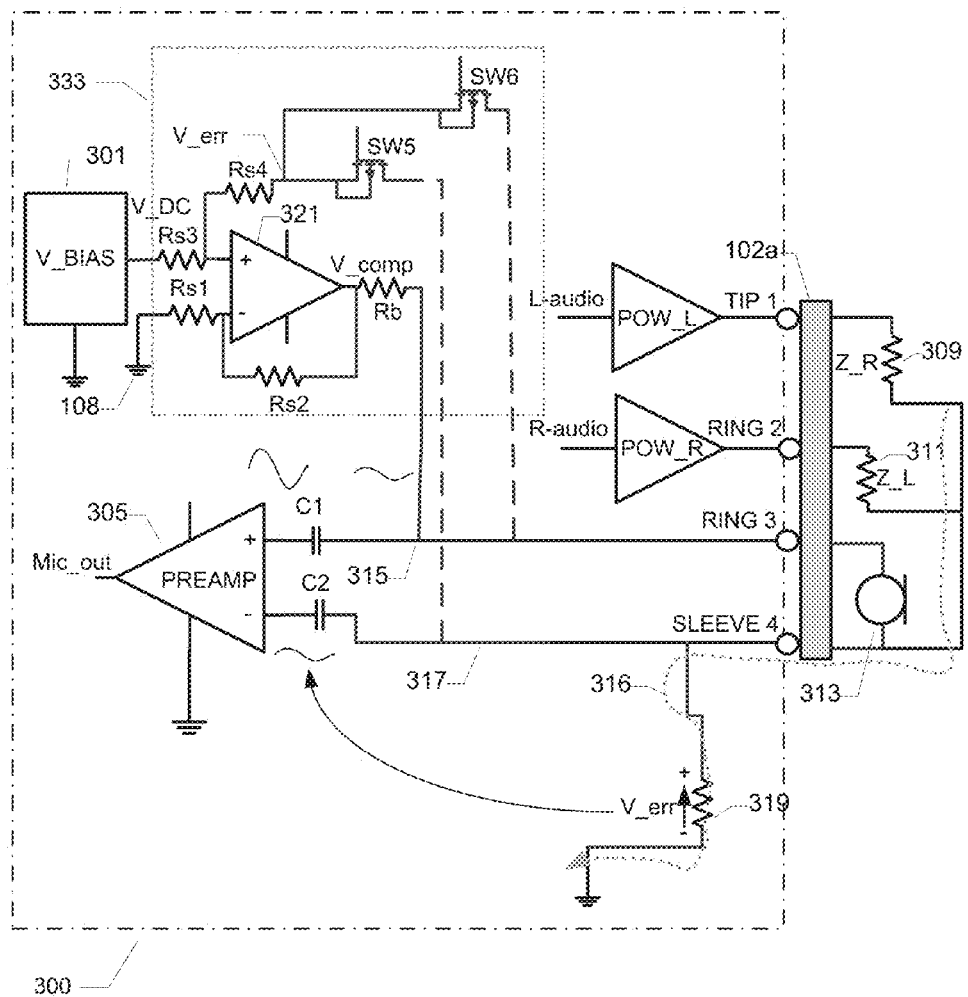
FIG. 3 is a detailed schematic block diagram of the headset driver circuit headset driver circuit with added error signal voltages.
Figure 4:
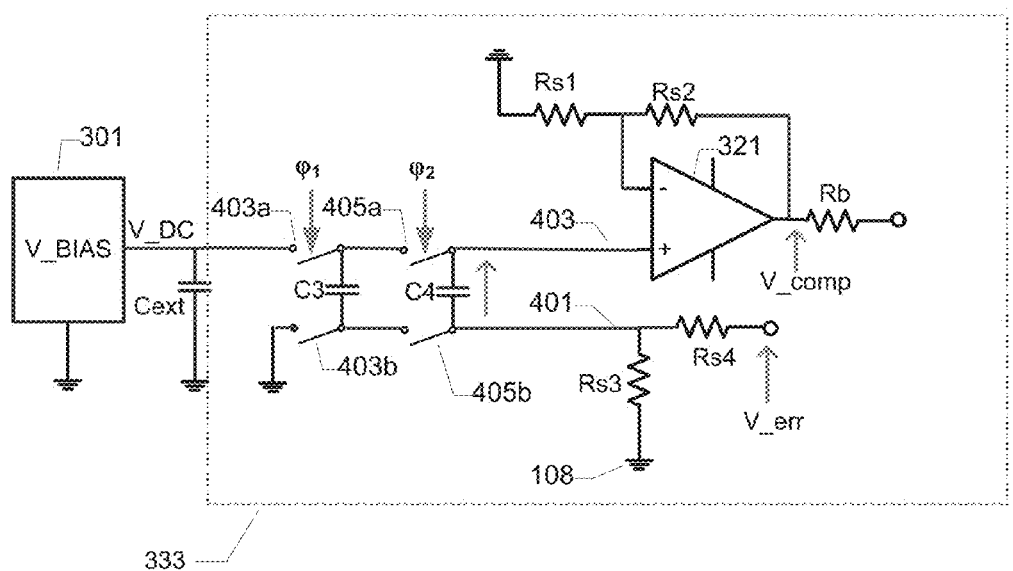
FIG. 4 shows a simplified schematic block diagram of an exemplary error suppression circuit of the headset driver circuit of FIG. 3.

FIG. 4 shows a simplified schematic block diagram of a preferred embodiment of the error suppression circuit 333 of the headset driver circuit of FIG. 3. The error suppression circuit 333 utilizes a switched capacitor arrangement comprising capacitors C3 and C4 to set a DC voltage at the non-inverting input 403 of the differential summing amplifier 321. The capacitor C4 is connected in series with the non-inverting input 403 with a second terminal connected to a mid-point or tap node 401 of a resistive voltage divider formed by the summing resistors Rs3 and Rs4. Yet another, and optional, capacitor Cext is coupled between the ground node or plane 108 and the DC bias voltage V_DC for ripple and noise suppression purposes.

The capacitor C3 is a switched capacitor which is coupled across the predetermined DC bias voltage V_DC and supplied with charge from the bias voltage generator 301 during a first phase $\phi_1$ of a two-phase non-overlapping switch control signal or clock. During the first phase $\phi_1$ of a two-phase non-overlapping switch clock, each of the switches 403a and 403b are closed or conducting which means C3 becomes charged approximately to the DC bias voltage V_DC. During the first phase $\phi_1$ of the two phase non-overlapping switch clock, each of the switches 405a and 405b are off or non-conducting such that the switched capacitor C3 is electrically disconnected from the capacitor C4 while being connected to the DC bias voltage V_DC. During the second phase $\phi_2$ of the two-phase non-overlapping switch clock, each of the switches 403a and 403b is in an off or open state while each of the switches 405a and 405b is on or in a conducting state. The latter switch arrangement state means that the switched capacitor C3 is disconnected from the predetermined DC bias voltage V_DC and ground node 108 and instead connected across the capacitor C4. Consequently, charge on the switched capacitor C3 may be dumped onto capacitor C4 and the latter becomes over time charged to the DC voltage level of the switched capacitor C3 which in turn charges to the DC bias voltage V_DC as explained above. Furthermore, the error voltage V_err is applied to the second terminal of the summing resistor Rs4 such that an attenuated error voltage component resides at the tap node 401 which is connected to the second terminal of the capacitor C4. Hence, the DC voltage across the capacitor C4, which approximately equals the predetermined DC bias voltage V_DC, is now placed in series with the attenuated error voltage V_err such that the input voltage at the non-inverting input 403 of the differential summing amplifier 321 effectively becomes the sum of the attenuated error voltage component and the predetermined DC bias voltage. As discussed above, the AC and DC amplification properties of the differential summing amplifier 321 ensures that a suitably scaled error compensated DC bias voltage V_comp may generated at the output V_DC output as shown in detail in FIGS. 3 & 4.

The input resistance of the non-inverting input of the differential summing amplifier 321 is preferably large to prevent discharge of the charge held on C4. This allows the capacitance, and therefore size and semiconductor die area consumption, of C4 to be small. The input resistance of the non-inverting input 403 of the differential summing amplifier 321 may for example exceed 1 GΩ, or even exceed 10 GΩ. The capacitance of C4 is preferably larger than 2 pF, for example larger than 10 pF or 20 pF, depending on various factors in the specific circuit design of the error suppression circuit 333 such as input capacitance of the non-inverting input of the differential summing amplifier 321. The capacitance of C4 is preferably much larger, for example at least 10 times larger, than the input capacitance of the non-inverting input of the differential summing amplifier 321 to prevent noticeable capacitive loading of C4. The capacitance of the switched capacitor C3 may be substantially identical to the capacitance of C4 or it may be smaller.

What is claimed is:

1. A headset driver circuit, configured to use at least one first amplifier to supply a first audio signal to a headset, the headset driver circuit comprising:
    a connector interlace including a plurality of terminals for connecting to the headset;
    at least one second amplifier for receiving a second audio signal from the headset, the second amplifier having first and second signal inputs connected to respective terminals of the connector interface; and
    an error suppression circuit coupled to the first and second signal inputs and configured to generate an error compensation signal based on a noise or error voltage at a ground connected one of the first and second signal inputs.

2. A headset driver circuit according to claim 1, wherein the plurality of terminals includes a first terminal and a second terminal for establishing respective electrical connections to a microphone and a common ground node of the headset, the headset driver circuit further comprising:
    a first switch arrangement comprising a first ground switch configured for selectively connecting and disconnecting the first terminal and a ground node of the headset driver circuit and a second ground switch configured for selectively connecting and disconnecting the second terminal and the ground node, wherein only one of the first ground switch and the second ground switch is closed at any particular time.

3. A headset driver circuit according to claim 2, further comprising:
    a bias voltage generator configured to generate a predetermined DC bias voltage, wherein the second amplifier is a differential preamplifier configured to generate a microphone output voltage, wherein the first signal input is coupled to the first terminal of the connector interface and the second signal input is coupled to the second terminal of the connector interface, wherein the error suppression circuit senses the noise or error voltage at the first terminal when ground connected or the second terminal when ground connected, and wherein the error suppression circuit is further configured to add the sensed noise or error voltage to the predetermined DC bias voltage to generate the error compensation signal as an error compensated microphone DC bias voltage for the ungrounded one of the first and second terminals of the connector interface.

4. A headset driver circuit according to claim 3, further comprising:
    a second switch arrangement configured to couple the first terminal or the second terminal of the connector interface to an input of the error suppression circuit; and
    a third switch arrangement configured to couple the error compensated DC bias voltage to the one of the first and second terminals not connected to the input of the error suppression circuit.

5. A headset driver circuit according to claim 3, wherein the error suppression circuit includes a differential summing amplifier configured to superimpose the noise or error voltage onto the predetermined DC bias voltage at a first input of the differential summing amplifier to generate the error compensated microphone DC bias voltage at a summing amplifier output.

6. A headset driver circuit according to claim 5, wherein the differential summing amplifier of the error suppression circuit includes a feedback circuit connected from the summing amplifier output to a second input of the differential summing amplifier to set a DC gain from the first input of the differential summing amplifier to the summing amplifier output.

7. A headset driver circuit according to claim 5, wherein the error suppression circuit includes:
    a first capacitor connected in series between the first input of the differential summing amplifier and a noise or error voltage input of the error suppression circuit, and a switched capacitor coupled across the predetermined DC bias voltage during a first phase of a two phase non-overlapping switch control signal and coupled across the first capacitor during a second phase of the two phase non-overlapping switch control signal.

8. A headset driver circuit according to claim 7, wherein a capacitance of the first capacitor is at least 10 times larger than an input capacitance of the first input of the differential summing amplifier.

9. A headset driver circuit according to claim 7, wherein a capacitance of the first capacitor is larger than 10 pF.

10. A headset driver circuit according to claim 7, wherein a capacitance of the switched capacitor is smaller than 10 pF.

11. A headset driver circuit according to claim 5, wherein an input resistance at the first input of the differential summing amplifier is larger than 1 GΩ.

12. A headset driver circuit according to claim 1, wherein the error suppression circuit is configured to provide the error compensation signal at the other one of the first and second signal inputs.

13. A method for suppressing a noise or error voltage in a headset driver circuit, comprising:
    sensing, using an amplifier circuit, the noise or error voltage at a ground connected terminal of a connector interface of the headset driver circuit; and
    generating, based on the sensed noise or error voltage, a non-zero error compensation signal for an ungrounded terminal of the connector interface.

14. A method according to claim 13, wherein the plurality of terminals includes a first terminal and a second terminal for establishing respective electrical connections to a microphone and a common ground node of the headset, the method further comprising:
    selectively connecting and disconnecting the first terminal and a ground node of the headset driver circuit; and
    selectively connecting and disconnecting the second terminal and the ground node, wherein only one of the first terminal and the second terminal is grounded at any particular time.

15. A method according to claim 14, further comprising:
    generating a predetermined DC bias voltage;
    generating a microphone output voltage;
    sensing the noise or error voltage at the first terminal when the first terminal is ground connected or sensing the noise or error voltage at the second terminal when the second terminal is ground connected; and
    generating the error compensation signal as an error compensated microphone DC bias voltage for the ungrounded one of the first and second terminals of the connector interface by adding the sensed noise or error voltage to the predetermined DC bias voltage.

16. A method according to claim 15, further comprising:
coupling the first terminal or the second terminal of the connector interface to an input of an error suppression circuit for generating the error compensated microphone DC bias voltage; and
coupling the error compensated DC bias voltage to the one of the first and second terminals not connected to the input of the error suppression circuit.

17. A method according to claim 15, further comprising:
superimposing the noise or error voltage onto the predetermined DC bias voltage to generate the error compensated microphone DC bias voltage.

18. A system for suppressing a noise or error voltage in a headset driver circuit, comprising:
means for sensing the noise or error voltage at a ground connected terminal of a connector interface of the headset driver circuit; and
means for generating, based on the sensed noise or error voltage, an error compensation signal for an ungrounded terminal of the connector interface.

19. A system according to claim 18, wherein the plurality of terminals includes a first terminal and a second terminal for establishing respective electrical connections to a microphone and a common ground node of the headset, the system further comprising:
means for selectively connecting and disconnecting the first terminal and a ground node of the headset driver circuit; and
means for selectively connecting and disconnecting the second terminal and the ground node, wherein only one of the first terminal and the second terminal is grounded at any particular time.

20. A system according to claim 19, further comprising:
means for generating a predetermined DC bias voltage;
means for generating a microphone output voltage;
means for performing the sensing by sensing the noise or error voltage at the first terminal when ground connected or the second terminal when ground connected; and
means for generating the error compensation signal as an error compensated microphone DC bias voltage for the ungrounded one of the first and second terminals of the connector interface by adding the sensed noise or error voltage to the predetermined DC bias voltage.

21. A system according to claim 20, further comprising:
means for superimposing the noise or error voltage onto the predetermined DC bias voltage to generate the error compensated microphone DC bias voltage.

22. A system according to claim 18, further comprising means for providing the error compensation signal at an amplifier input in the headset driver circuit.

* * * * *